(12) United States Patent
Kamikakoi et al.

(10) Patent No.: US 7,558,059 B2
(45) Date of Patent: Jul. 7, 2009

(54) CIRCUIT BOARD AND ELECTRONIC APPARATUS

(75) Inventors: Hideaki Kamikakoi, Kawasaki (JP); Manabu Keyaki, Kawasaki (JP); Yoichi Isobe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/544,605

(22) Filed: Oct. 10, 2006

(65) Prior Publication Data

US 2007/0030648 A1 Feb. 8, 2007

Related U.S. Application Data

(62) Division of application No. 10/948,706, filed on Sep. 24, 2004.

(30) Foreign Application Priority Data

May 14, 2004 (JP) ............................. 2004-145504

(51) Int. Cl.
*G05F 1/16* (2006.01)
(52) U.S. Cl. ..................... 361/686; 710/303; 710/304
(58) Field of Classification Search ................. 710/303, 710/304; 361/679–686
See application file for complete search history.

(56) References Cited

U.S. PATENT DOCUMENTS

| 5,278,730 | A |  | 1/1994 | Kikinis |  |
|---|---|---|---|---|---|
| 5,331,509 | A |  | 7/1994 | Kikinis |  |
| 5,539,616 | A |  | 7/1996 | Kikinis |  |
| 5,600,800 | A |  | 2/1997 | Kikinis et al. |  |
| 5,634,080 | A |  | 5/1997 | Kikinis et al. |  |
| 5,640,302 | A |  | 6/1997 | Kikinis |  |
| 5,680,126 | A |  | 10/1997 | Kikinis |  |
| 5,689,654 | A |  | 11/1997 | Kikinis et al. |  |
| 5,708,840 | A |  | 1/1998 | Kikinis et al. |  |
| 5,799,067 | A |  | 8/1998 | Kikinis et al. |  |
| 5,799,068 | A |  | 8/1998 | Kikinis et al. |  |
| 5,861,873 | A |  | 1/1999 | Kikinis |  |
| 6,233,145 | B1 | * | 5/2001 | Ohnishi | 361/686 |
| 6,421,237 | B1 | * | 7/2002 | Kim | 361/686 |
| 6,563,702 | B1 | * | 5/2003 | Shin et al. | 361/686 |
| 6,778,385 | B2 | * | 8/2004 | Forlenza et al. | 361/686 |
| 6,839,228 | B2 | * | 1/2005 | Choi | 361/685 |
| 7,123,476 | B2 | * | 10/2006 | Ke | 361/686 |
| 2002/0181199 | A1 | * | 12/2002 | Bovio et al. | 361/686 |
| 2003/0084222 | A1 | * | 5/2003 | Wurzburg | 710/303 |

(Continued)

FOREIGN PATENT DOCUMENTS

EP 0548404 A 7/1996

(Continued)

*Primary Examiner*—Jayprakash N Gandhi
*Assistant Examiner*—Anthony Q Edwards
(74) *Attorney, Agent, or Firm*—Arent Fox LLP (57) ABSTRACT

A circuit board is used in common for the first electronic apparatus as the first configuration and for the second electronic apparatus as the second configuration, and the circuit board includes an area which is used in common for installing the first electronic device in installing the circuit board into the first electronic apparatus, and for installing the second electronic device in installing the circuit board into the second electronic apparatus, wherein the first electronic device is used only for the first electronic apparatus, and the second electronic device is used only for the second electronic apparatus.

4 Claims, 6 Drawing Sheets

U.S. PATENT DOCUMENTS

| | | | | |
|---|---|---|---|---|
| 2003/0198014 | A1* | 10/2003 | Murayama | 361/365 |
| 2003/0202323 | A1* | 10/2003 | Maeda | 361/686 |
| 2004/0246670 | A1* | 12/2004 | Lai | 361/683 |
| 2005/0168937 | A1* | 8/2005 | Yin et al. | 361/686 |

FOREIGN PATENT DOCUMENTS

| | | |
|---|---|---|
| JP | 8-501165 | 6/1996 |
| JP | 08-241258 | 9/1996 |
| JP | 08249932 | 9/1996 |
| JP | 09-097124 | 4/1997 |
| JP | 09-114554 | 5/1997 |
| JP | 09-135058 | 5/1997 |
| JP | 09-283872 | 10/1997 |
| JP | 2000-112565 | 4/2000 |
| JP | 2000-353887 | 12/2000 |
| JP | 2003-280769 | 10/2003 |
| JP | 2003-318556 | 11/2003 |

* cited by examiner

CIRCUIT BOARD AND ELECTRONIC APPARATUS

This application is a divisional of U.S. patent application Ser. No. 10/948,706, filed Sep. 24, 2004, which is based upon and claims the benefit of priority from Japanese Patent Application No. 2004-145504 filed on May 14, 2004. The entire content of this application is incorporated herein by reference.

BACKGROUND OF THE INVENTION

The present invention relates generally to a circuit board, a mounting structure, a mounting method, and an electronic apparatus, and more particularly to a circuit board that is used in common for domestic (i.e., Japanese) market and for overseas market. The present invention is suitable for a motherboard (main board) that is installed in, for example, notebook type computers, personal digital assistants (PDA), handy game instruments, handy electronic apparatuses such as drive units, space saving type electronic apparatuses such as desktop computers or word processors of display integrated type or slim type.

The demand for electronic apparatuses such as personal computers is now growing. Particularly, handy data processing apparatuses such as notebook type personal computers (hereinafter, "note PCs".) or PDAs are remarkably improving and widespreading, and they are demanded to be smaller and thinner. Furthermore, various functions or apparatuses are installed in the handy data processing apparatuses so as to satisfy the demand for them to have higher performance and more various functions.

However, the demand to be smaller and thinner is basically contrary to the demand to have higher performance and more various functions. The data processing apparatus becomes big in accordance with having more functions. Still more, the data processing apparatus (or electronic devices installed in the data processing apparatus) generally generates more heat in accordance with having higher performance or more functions. The data processing apparatus will become bigger in accordance with increasing the functions because it also needs cooling function. Therefore, to make the handy data processing apparatus be small, thin, lightweight, high performance, and various functions, the decision of installing the higher necessary performances and functions and not installing the lower necessary performances and functions in the data processing apparatus is needed.

The necessity of the performances and functions often depends on the consumer targeted. The consumer targeted can be classified, for example, by consumer's age or market destination (domestic or overseas such as to the U.S.A. or to Europe). Therefore, the functions to be installed are differently selected in accordance with grade or market destination in the same series of the data processing apparatuses.

In such case for example, a motherboard optimized only for Japanese domestic market is used for a note PC for Japanese domestic market, and a motherboard optimized only for overseas market is used for a note PC for overseas market.

However, many kinds of motherboards should be manufactured for one series of the data processing apparatus if the exclusive motherboards are respectively used for every grade or destination. Thus, many kinds of production molds or production lines of the motherboards should be prepared and it results increase of the production cost. Many kinds of motherboards confuse the assembling process, and it results decrease of assembling performance.

BRIEF SUMMARY OF THE INVENTION

Accordingly, it is an exemplary object to provide a novel and useful circuit board, a mounting structure, and an electronic apparatus having the same. Concretely, it is an exemplary object to provide a circuit board that can have performances or functions for many grade or destinations of electronic apparatuses and can be used in common for many grades or destinations, and can decrease the production cost and increase the assembling performance of the electronic apparatuses.

To achieve above-mentioned objects, a circuit board of one aspect according to the present invention is used in common for the first electronic apparatus as the first configuration and for the second electronic apparatus as the second configuration. The circuit board includes an area which is used in common for installing the first electronic device in installing the circuit board into the first electronic apparatus, and for installing the second electronic device in installing the circuit board into the second electronic apparatus, wherein the first electronic device is particularly used for the first electronic apparatus, and the second electronic device is particularly used for the second electronic apparatus.

Here, the electronic apparatus is, for example, a note PC. And a desktop type personal computer or handy data processing apparatus and the like is applicable to the electronic apparatus. For example, the first configuration and the second configuration means respectively for domestic market and for overseas market, or two different grades of the electronic apparatus. That is, the first electronic apparatus and the second electronic apparatus are the same series but different specifications (configurations). The first electronic device that is particularly used for the first electronic apparatus is, for example, a floppy disk drive unit, and the second electronic device that is particularly used for the second electronic apparatus is, for example, high performance VGA (Video Graphic Array) device which is higher resolution (higher performance) than a standard VGA device. For example, the standard VGA device can display in a resolution of at least 640×480 dots, and the high performance VGA device can display in a resolution of at least 1280×1024 dots.

As the circuit board can be used in common for domestic market (the first configuration) and for overseas market (the second configuration), many kinds of the circuit board do not have to be produced for one series of the electronic apparatus (for example, note PC). Therefore, it can decrease the production cost and increase the assembling performance. The floppy disk drive unit (the first electronic device) is installed and the high performance VGA device (the second electronic device) is not installed in the electronic apparatus for Japanese domestic market. While, the high performance VGA device is installed and the floppy disk drive unit is not installed in the electronic apparatus for overseas market. A specific area is used in common for installing both devices. In accordance with the destination, the floppy disk drive unit or the high performance VGA device is selectively installed on the specific area. Therefore, the space in the electronic apparatus will be used more effectively, and the electronic apparatus will become smaller and thinner. The specific area is substantially rectangular shape on the circuit board and the size of the area is preferably 96 mm×126 mm or larger. Then, the floppy disk drive unit can be located in the area easily, and influence to other devices on the circuit board can be minimized.

The third electronic device may be installed on the circuit board both in the first configuration and the second configuration, and the second electronic device may be used instead of the third electronic device alternatively. The third electronic device means, for example, the standard VGA device that is installed in the electronic apparatus for both domestic market and overseas market. The high performance VGA device is used instead of the standard VGA device in the electronic apparatus for overseas market so that it can display with high resolution to satisfy foreign consumer's demand.

The circuit board may be a single board on which a processing circuit that processes a main control of the first electronic apparatus or the second electronic apparatus is installed. The single board may be a motherboard. The processing circuit may be a CPU. If the circuit board is the motherboard on which the CPU is installed, the space in the electronic apparatus will be used more effectively and the electronic apparatus will become smaller and thinner.

The first electronic device may include a drive unit for portable storage media and the second electronic device may include a display circuit. For example, the floppy disk drive unit can be used as the drive unit for portable storage media and the high performance VGA device can be used as the display device. In this case, the floppy disk drive unit or the high performance VGA device can be selectively installed on the circuit board in accordance with the configuration (destination) of the electronic apparatus. Still, in the specific area on the circuit board in the electronic apparatus of the second configuration, at least a device to connect an external memory, a device to connect a IEEE1394 connector, a device to connect a video connector, a device to connect a USB (Universal Serial Bus) connector, a device for Bluetooth, and a connector to connect a cooler to cool the high performance VGA device may be installed with the high performance VGA device. Here, the device to connect the external memory means a drive unit that has a slot to insert the external memory such as SD (Secure Digital) memory, memory stick, and the like. The device to connect the IEEE1394 connector means, for example, a connection port based on IEEE1394 standard, and it can be connected with the digital video camera, and the like. The device to connect the video connector means, for example, a S-Video connection port, and it can be connected with the video unit that has the S-Video connector. The device to connect the USB connector means USB connection port, and it can be connected with various external apparatus that is based on the USB standard. A device for Bluetooth means, for example, a wireless communication device to transmit or receive the wireless data that is based on the Bluetooth standard. These devices are sometimes necessary for the electronic apparatus of the second configuration (for overseas market) and not necessary for that of the first configuration (for domestic market). Therefore, by arranging these devices in the specific area unitedly, there will be no devices in the specific area on the circuit board in the electronic apparatus of the first configuration. Thus, the specific area can be used effectively for other devices or functions.

A cooler to cool the second electronic device may be installed on the circuit board. The high performance VGA device used as the second electronic device generates a lot of heat. However, installing the cooler can minimize a bad influence such as thermal runaway.

The cooler may be installed in the specific area. The first electronic device is not installed in the second configuration, and the cooler can be easily arranged in the specific area. The size, especially the thickness of the electronic apparatus will merely increase.

The cooler may be a heat sink unit that includes a heat receiving plate that receives heat from the second electronic device by contacting the second electronic device, a heat conductor that conducts heat from the heat receiving plate to a radiation plate, and a cooling fan that cools the radiation plate by blowing. Thus, the cooler can cool the second electronic device effectively.

The heat sink unit may have a ventilator that exhausts air from the cooling fan, and the ventilator may be located near a device to connect an external memory that is installed on the circuit board. As the device to connect the external memory merely generates heat, the cooling efficiency does not decrease when the ventilator is located near or on the device. It is not difficult to design the height (i.e., the size along the thickness of the electronic apparatus) of the device to connect the external memory and of the ventilator be small. Therefore, it does not increase the thickness of the electronic apparatus.

An extension connector part may be installed on the circuit board. Here, the extension connector may connect an extension unit that is removablly attachable to the first electronic apparatus and the second electronic apparatus. As the extension unit or the external apparatus can be attachable to the electronic apparatus via the extension connector part, the expansivity of the electronic apparatus will be improved.

The extension connector part may be installed substantially adjacent to both the install position of the second electronic device on the circuit board and the install position of the third electronic device on the circuit board. The further the extension connector part to connect the extension unit is from the VGA device, the longer the lead cable or the lead pattern between them is, and the bigger the influence of signal noise is. Therefore, the noise signal will be overlapped on the image signal transmitted by the lead cable or the lead pattern, and the VGA device cannot put out the performance sufficiently. Thus, the extension connector part is preferable to be near the VGA device. By locating the install position of the extension connector part substantially adjacent to the install position of the VGA device (the second electronic device or the third electronic device), the VGA device will put out its performance sufficiently.

The second electronic device may be installed at a position in the area so that the distance between the extension connector part and the second electronic device is substantially the same as the distance between the extension connector part and the third electronic device. By equalizing the distance from the extension connector part to two VGA devices (the second and the third electronic devices), transmission quality of the image signal will not be different in the first configuration and in the second configuration.

The extension connector part may be installed in an overlapped area that is used both when the circuit board is installed in the electronic apparatus in the first direction and when the circuit board is installed in the electronic apparatus in the second direction.

Here, the first direction is, for example, the width direction of the electronic apparatus in using state (hereinafter, "width direction".). The second direction is, for example, the depth direction of the electronic apparatus in using state (hereinafter, "depth direction".). On reason for designing, there are two types of the motherboard installed in the electronic apparatus. One is a motherboard of width direction layout, and the other is that of depth direction layout. While, extension unit is used in common in a lot of electronic apparatuses in spite of the motherboard's layout direction. So, the position and the shape of the extension connector part are preferably the same in every kind of the electronic apparatus. By locating the extension connector part in the overlapped area, same extension connector part can be used both in the electronic apparatus having the motherboard of width direction layout and in the electronic apparatus having the motherboard of depth direction layout.

An install position of the extension connector part may be within a specific distance from a back face of the electronic apparatus when the circuit board is installed in the electronic apparatus, and within a specific distance from a centerline of width of the electronic apparatus. For example, the install position of the extension connector part may be within 30 mm from the back face of the electronic apparatus, and within 30 mm from the centerline of width of the electronic apparatus when seen from a front face. Thus, the extension unit can be connected with the electronic apparatus at its back face easily. The arrangement of the circuit board in the electronic apparatus will become free.

The extension unit may be a connection apparatus that has a plurality of connectors for peripheral apparatuses. For example, the connection apparatus may be a port replicator. By connecting the port replicator with the electronic apparatus, more external apparatuses can be connected with the electronic apparatus via the port replicator and the expansivity of the electronic apparatus improves.

The connection apparatus that has a width substantially the same as the width of the electronic apparatus may be removablly attachable to the back face of the electronic apparatus. The connection apparatus may have a projection part on which a connector being connectable to the extension connector part is located. As the width of the connection apparatus is substantially the same as the width of the electronic apparatus, feeling of use and portability of the electronic apparatus with the connection apparatus attached thereto will be good. The projection can make the size or the weight of the connection apparatus be reduced.

An electronic apparatus of another aspect according to the present invention includes the above mentioned circuit board installed therein. Thus, in addition to the above mentioned effects, it can make the electronic apparatus be small, thin, lightweight, high performance, and various functions. If the circuit board is the motherboard, it will not be necessary to prepare the several different motherboards for every grade or every destination in one series of the electronic apparatus. Therefore, it can decrease the production cost and increase the assembling performance.

The electronic apparatus may be used in common for the first configuration and for the second configuration, and may have a package being substantially rectangular parallelepiped shape. For example, the size of the package is 333 mm×285 mm×38 mm or smaller. It can decrease the production cost and increase the assembling performance because the package can be used in common for a plurality of the configurations. The size of 333 mm×285 mm×38 mm or smaller can make the notebook type computer be small.

The electronic apparatus may be a notebook type computer. Thus, the notebook type computer will be small, thin, lightweight, high performance, and various functions. And it can decrease the production cost and increase the assembling performance of the notebook type computer.

A circuit board of still another aspect according to the present invention is for an electronic apparatus. The circuit board has a plurality of electronic devices installed on the surface of the circuit board, and is used in common for at least two configurations. An install position of at least two electronic devices on the surface of the circuit board is in a united area. The at least two devices are not installed on the surface of the circuit board in the first configuration of the at least two configurations, and are installed on the surface of the circuit board in the second configuration of the at least two configurations.

An electronic apparatus of still another aspect according to the present invention includes a circuit board that has a plurality of electronic devices installed on the surface of the circuit board, and is used in common for at least two configurations. An install position of at least two electronic devices on the surface of the circuit board is in a united area. The at least two devices are not installed on the surface of the circuit board in the first configuration of the at least two configurations, and are installed on the surface of the circuit board in the second configuration of the at least two configurations. Here, the electronic apparatus includes at least either the first electronic apparatus or the second electronic apparatus.

As the circuit board is used in common for the domestic market (the first configuration) and for the overseas market (the second configuration), it is not necessary to produce many kinds of circuit boards for one series of the electronic apparatus. Therefore. it can decrease the production cost and increase the assembling performance. If a function is not installed in the electronic apparatus for domestic market and the same function is installed in that for overseas market, a plurality of the electronic devices in relation to the function are not installed on the circuit board for domestic market and are installed on that for overseas market. Arranging these electronic devices in the specific area unitedly can generate an empty area that has no electronic devices on the circuit board for domestic market. Thus, it will be easy to install other functions or other units that is necessary for domestic market but not necessary for overseas market in the empty area on the circuit board. Here, the united specific area means, for example, a rectangular shape area of a specific extent which has no electronic devices on the circuit board.

Other objects and further features of the present invention will become readily apparent from the following description of the preferred embodiments with reference to accompanying drawings.

DETAILED DESCRIPTION OF THE PREFERRED EMBODIMENTS

The Explanation of a Notebook Type Personal Computer For Overseas Market

Figure 1:
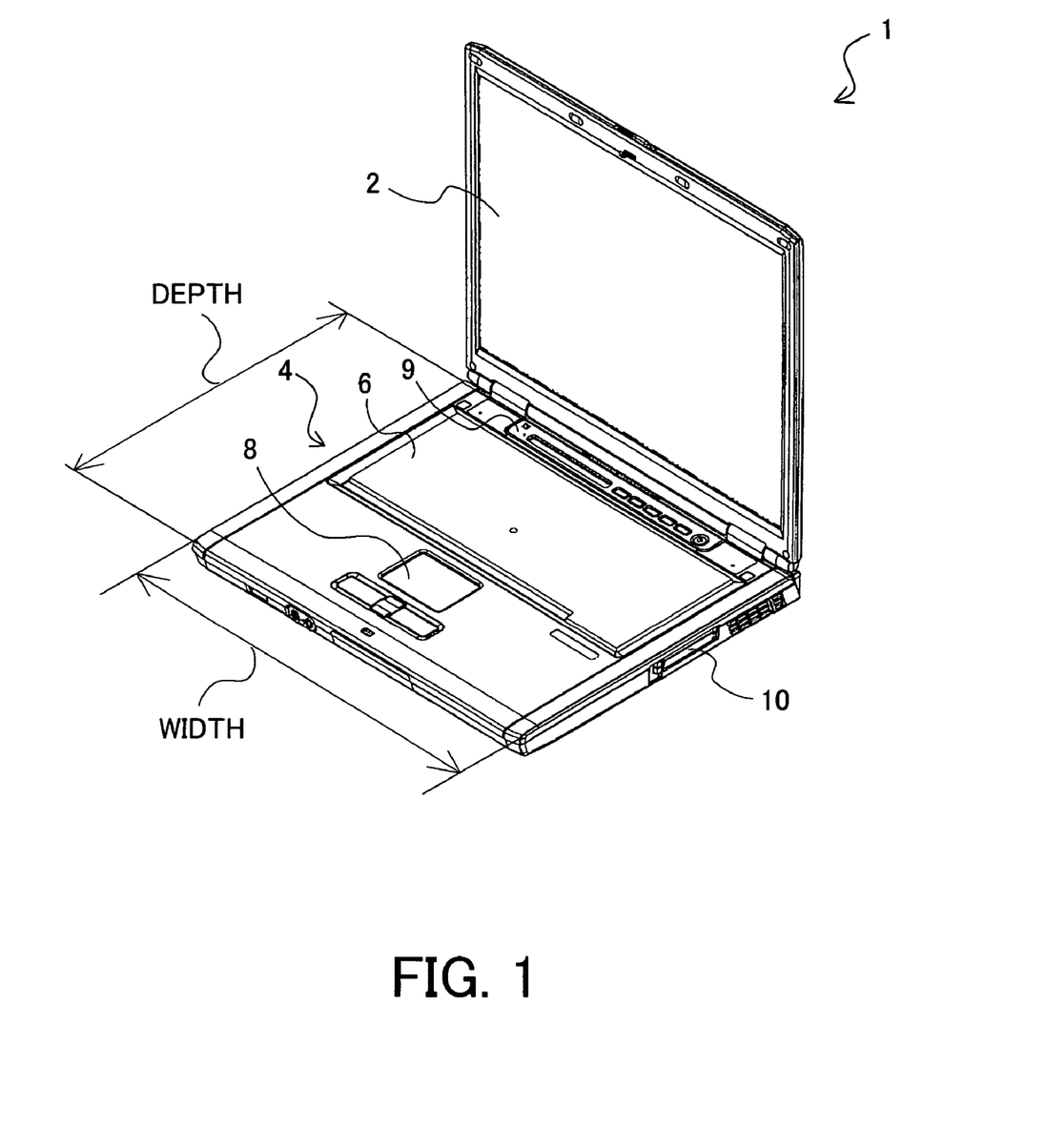
FIG. 1 is a perspective view of a notebook type personal computer including a motherboard of one embodiment according to the present invention.

Referring now to the accompanied drawings, a description will be now given of a circuit board of one embodiment according to the present invention. FIG. 1 is a perspective view of a notebook type personal computer 1 (note PC 1) as an electronic apparatus including a motherboard (single board) as one embodiment of a circuit board according to the present invention. The note PC 1 has a display part 2 and a main unit 4. The display part 2 is rotatablly connected with the main unit 4 by a hinge, and it can be open and close. This note PC 1 is a computer (the second electronic apparatus) for overseas market (the second configuration), and a computer (the first electronic apparatus) for domestic market (the first configuration) in the same series will be explained later.

The display part 2 is for displaying various information such as movies, pictures, or characters, and uses for example a liquid crystal display unit (LCD) of 15 inches or 17 inches. The note PC 1 is folded by rotating the display part 2 toward the main unit 4 around the hinge when a user does not use the note PC 1. The display part 2 is opened and raised from the main unit 4 when the user uses the note PC 1.

The main unit 4 has most of basic functions of the note PC 1. For example, the main unit 4 includes a keyboard 6, a touch panel 8, and a sub display 9 on its surface. The keyboard 6 is an input device by using the keys for the user to input information to the note PC 1. The touch panel is also a kind of input devices, and uses for example an electrostatic touch sensor. A mouse cursor moves in the display part 2 in accordance with the movement of the user's finger on the touch panel 8. The sub display 9 indicates a status of the note PC1 such as a power on/off, a hard disk status, and a battery charge status. For example, the sub display 9 uses LEDs or monochrome LCD.

The main unit 4 further has a power switch (not shown), a PC card drive unit 10, an optical disk drive unit 12 (see also FIG. 4B), SD card drive unit (a device to connect an external memory) 14, a IEEE1394 port 16, a S-Video connection port 18, and a USB port 20 on its side face. The PC card drive unit 10 is for inserting and connecting the card devices that is based on the PC card standard and have various functions. The optical disk drive unit 12 is for reading the data from CD-ROM. It can have functions of reading from or writing to CD-R, CD-RW, DVD-ROM, DVD-R, DVD-RW, or DVD-RAM. The SD card drive unit 14 is for inserting and connecting the SD card as an external memory. The main unit 4 can include a compact flash memory drive unit or memory stick drive unit instead of the SD card drive unit 14. The IEEE1394 port 16 is for connecting various apparatuses based on IEEE1394 standard. For example, a digital video camera is connected with the IEEE1394 port 16. The S-Video connection port 18 is for connecting imaging apparatuses that output S-Video signal. The USB port 20 is for connecting various apparatuses based on USB standard.

Figure 2:
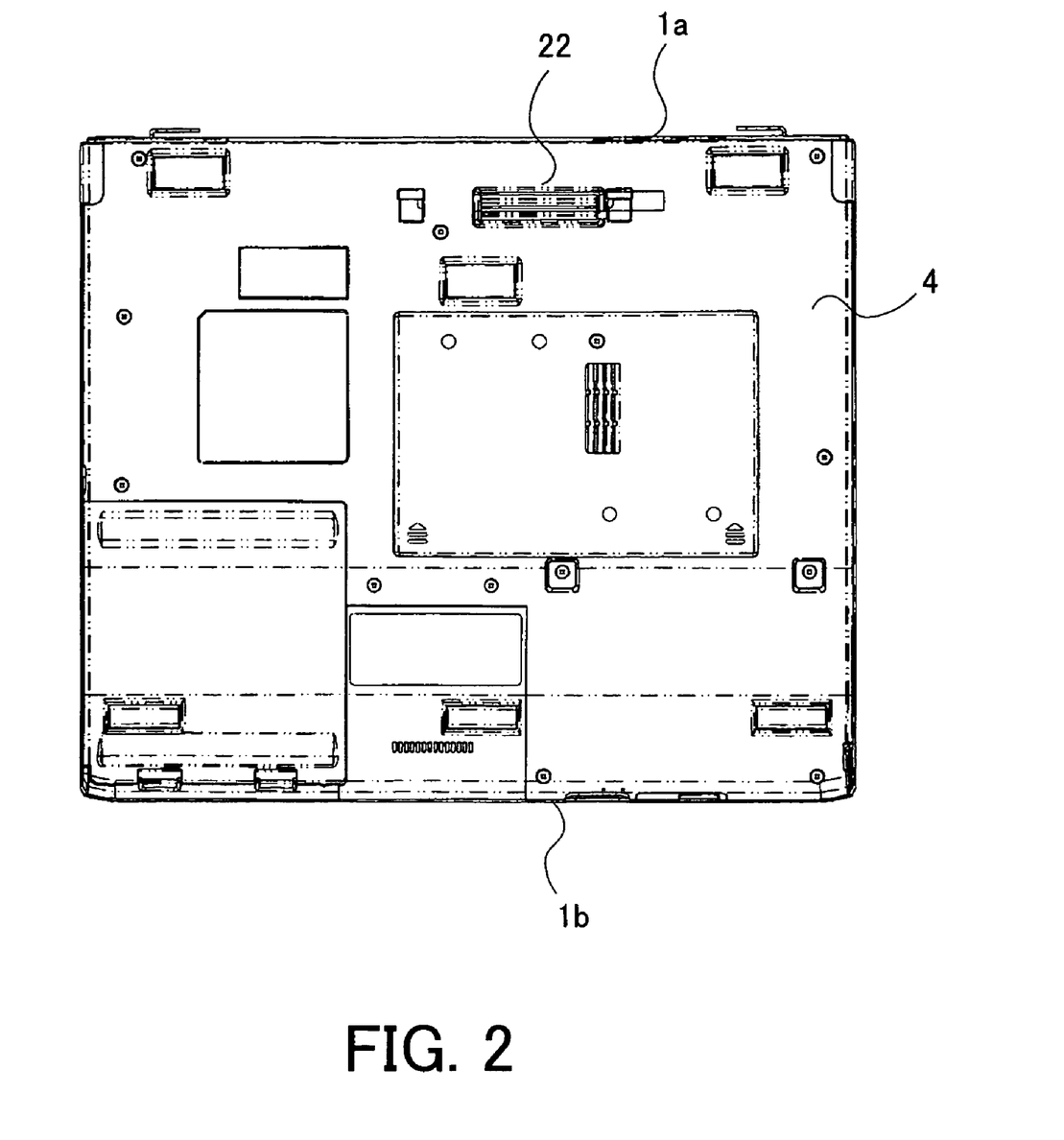
FIG. 2 is a bottom view of the notebook type personal computer shown in FIG. 1.

FIG. 2 is a bottom view of the main unit 4 seen from bottom face. As shown in FIG. 2, the main unit 4 has an extension connector part 22 on its bottom face to connect a port replicator (a connection apparatus) 23 as an extension unit (see also FIG. 3). The extension connector part 22 is located within 30 mm as a specific distance from a back face 1a of the note PC 1. When seen from a front face 1b in using state of the note PC 1, the extension connector part 22 is located within 30 mm as a specific distance to the left (to the right in FIG. 2) from a centerline of width of the note PC 1. Thus, shown in FIGS. 4A and 4B, the port replicator 23 can be attached to or removed from the back face 1a of the note PC 1 easily. As the extension connector part 22 can be installed on the motherboard both in the depth direction layout and in the width direction layout which will be explained later, the arrangement of the motherboard in the main unit 4 becomes free.

Figure 3:
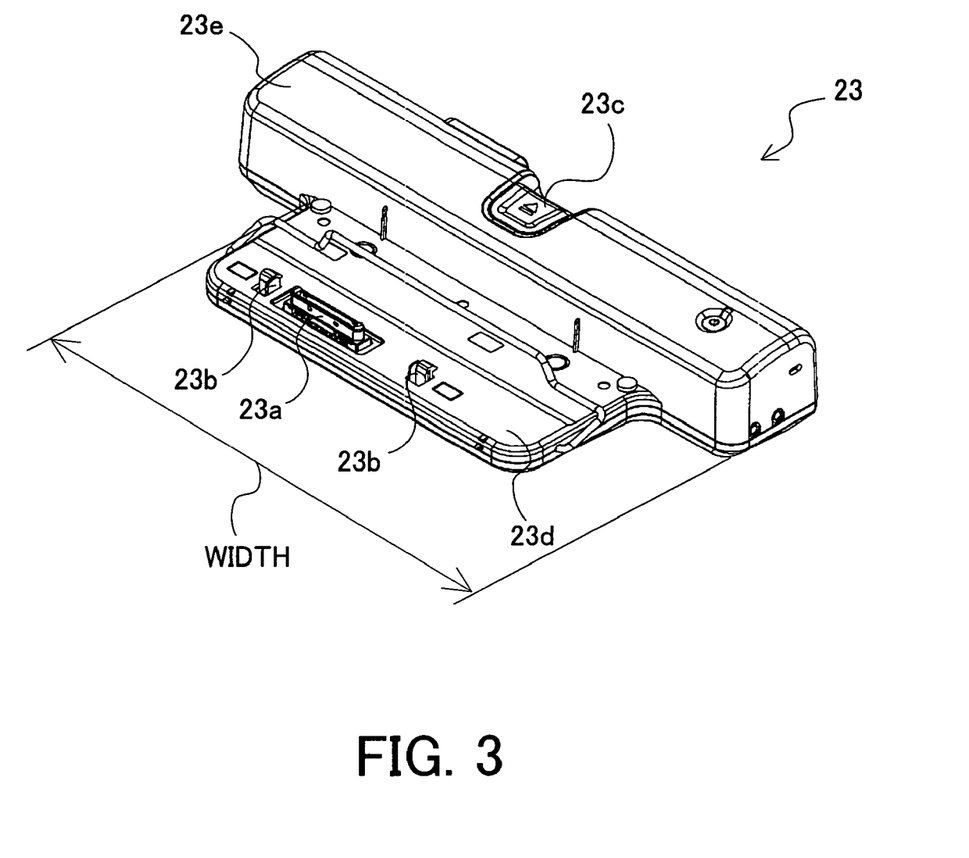
FIG. 3 is a whole perspective view of a port replicator used with the notebook type personal computer shown in FIG. 1.
Figure 4A:
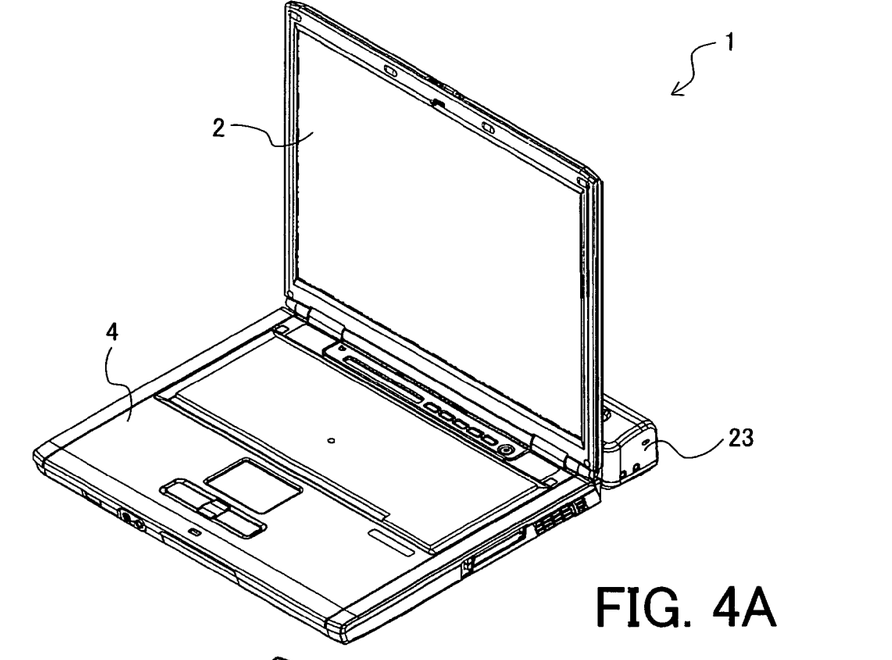
FIG. 4A is a perspective view seen from front face in the state of connecting the port replicator with the notebook type personal computer shown in FIG. 1.
Figure 4B:
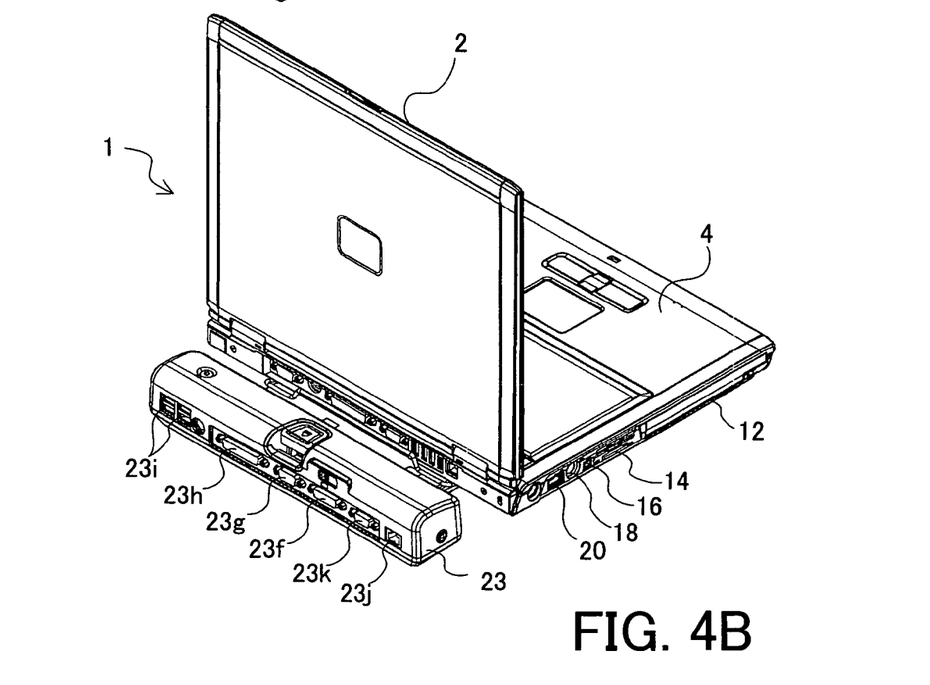
FIG. 4B is a perspective view seen from back face in the state of connecting the port replicator with the notebook type personal computer shown in FIG. 1.

FIG. 3 is a whole perspective view of the port replicator 23 as the extension unit. The port replicator 23 includes a connector 23a to be connected electrically with the extension connector part 22 on the main unit 4, a connecting part 23b to be connected mechanically with the back face 1a of the main unit 4, and a release button 23c that is used to release the port replicator 23 from the main unit 4. The connector 23a is arranged on a projection 23d partially projected from a main body 23e. The width of the main body 23e is approximately the same as the width of the note PC 1. The port replicator 23 is a connection apparatus that can connect various apparatuses with the note PC 1 by expanding the function of the note PC 1. As shown in FIG. 4B, a lot of ports (connectors for peripheral apparatuses) such as a LAN port 23j, an analog RGB output port 23k, an optical digital output port 23f, a serial port 23g, a parallel port 23h, and a USB port 23i are located on the back face of the port replicator 23. By connecting external apparatuses with these ports via cables, the note PC 1 can further expand the functions.

Figure 5:
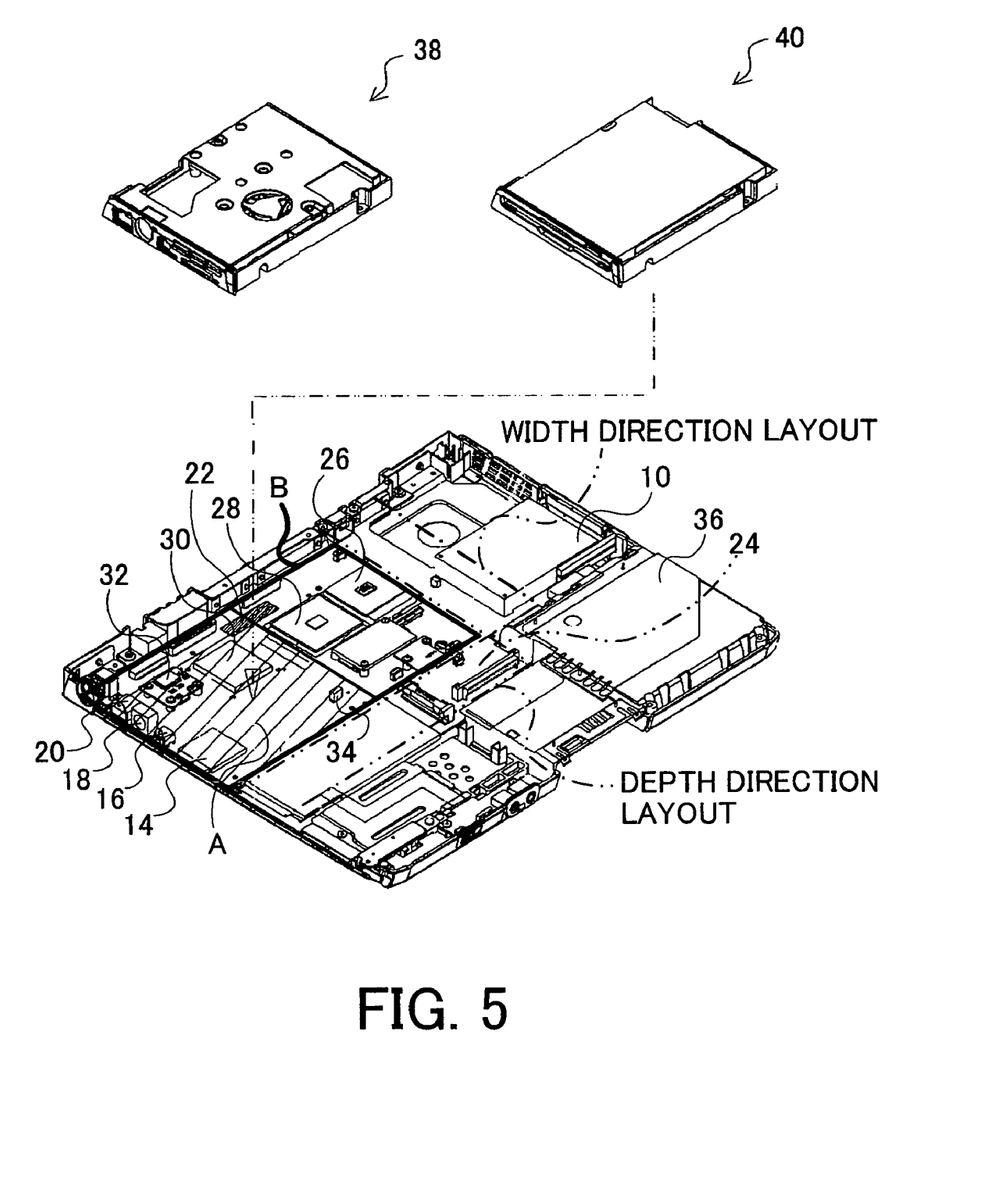
FIG. 5 is a whole perspective view of the motherboard installed in a main unit of the notebook type personal computer shown in FIG. 1.

The main unit 4 includes a motherboard 24 as a circuit board therein. FIG. 5 is a whole perspective view of the motherboard 24. On the one side of the motherboard 24, a CPU (a processing circuit) 26, a memory as an information storage device (not shown), a standard VGA device (the third electronic device, a display circuit) 28, a high performance VGA device (the second electronic device, a display circuit) 30, a Bluetooth unit (a device for Bluetooth) 32, and a connector for heat sink unit (connector for cooler) 34 are installed. And the extension connector part 22 for the port replicator is installed on the other side of the motherboard 24. A lot of other devices are installed on the motherboard 24, and the PC card drive unit 10, a battery 36, and the optical disk drive unit 12 are also arranged on the motherboard 24.

The motherboard 24 is, for example, a rectangular shape. If the motherboard 24 is arranged with its long side along the width direction (the first direction) of the main unit 4, it is called "width direction layout". If the motherboard 24 is arranged with its long side along the depth direction (the second direction) of the main unit 4, it is called "depth direction layout". There are width direction layout type motherboard 24 and depth direction layout type motherboard 24. An area that is overlapped by width direction layout type motherboard and depth direction layout type motherboard in the main unit 4 is called an overlapped area B (the area enclosed by thick line in FIG. 5). The extension connector part 22 is located in the overlapped area B. Thus, the port replicator 23 can be used in common for the note PC 1 including the width direction layout type motherboard and for the note PC 1 including the depth direction layout type motherboard because the position of the extension connector part 22 does not change.

The standard VGA device 28 and the high performance VGA device 30 are both electronic devices for displaying graphics. They has a function of processing the positions or colors in displaying movies, pictures, or characters on the display part 2. The standard VGA device 28 is, for example, for displaying the movies etc. on the display part 2 with 640×480 dots. The high performance VGA device 30 is, for example, for displaying the movies etc. on the display part 2 with 1280×1024 dots and has a resolution higher than the standard VGA device does. The Bluetooth unit 32 is a wireless communication device to transmit or receive the wireless data that is based on the Bluetooth standard. The connector 34 for heat sink unit is a power supply connector that supplies electric power to the heat sink unit (the cooler) 38 for the high performance VGA device 30, explained later.

Figure 6A:
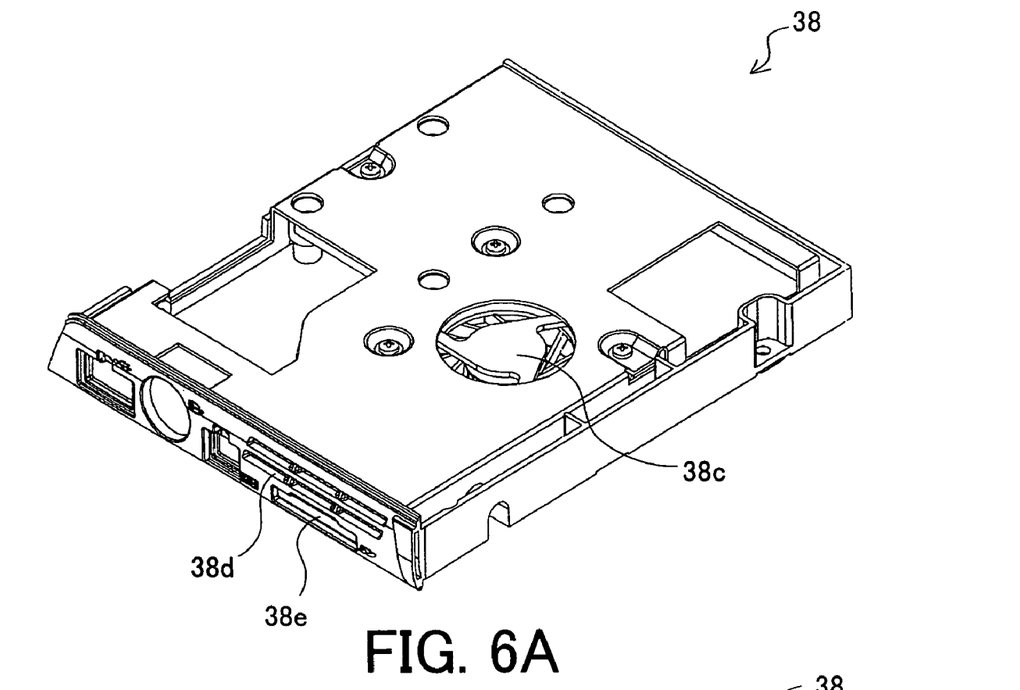
FIG. 6A is a perspective view of top face of a heat sink unit to be installed in the notebook type personal computer shown in FIG. 1.
Figure 6B:
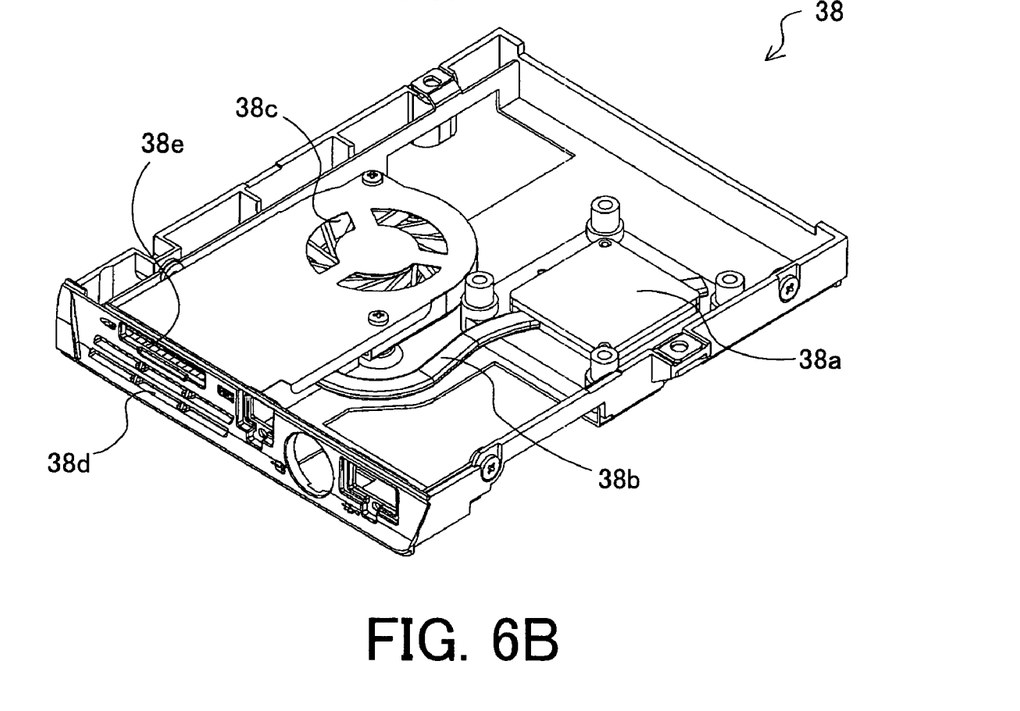
FIG. 6B is a perspective view of bottom face of the heat sink unit to be installed in the notebook type personal computer shown in FIG. 1.

On the motherboard 24, the SD card drive unit 10, the IEEE1394 port 16, S-Video connection port 18, the USB port 20, the high performance VGA device 30, the Bluetooth unit 32, the connector 34 for heat sink unit as electronic devices (hereinafter, these seven electronic devices are generically called "the electronic devices for overseas only") are unitedly installed in the specific area A of approximately rectangular shape shown in FIG. 5 as a hatching part. And above the specific area A, the heat sink unit 38 is arranged so as to cover the electronic devices for overseas only. FIG. 6A is a perspective view of top face of the heat sink 38 and FIG. 6B is a perspective view of bottom face of the heat sink 38. The heat sink unit 38 includes a heat receiving plate 38a, a heat pipe (a heat conductor) 38b, a heat radiation plate (not shown), a cooling fan 38c, and a ventilator 38d. The heat receiving plate 38a receives the heat from the high performance VGA device 30 by contacting to the top face of the high performance VGA device 30, the heat is conducted by the heat pipe 38b to the heat radiation plate located near the ventilator 38d, and the radiation plate is cooled by blowing of the cooling fan 38c. The blowing air is exhausted to out of the note PC 1 through the ventilation 38d. The ventilation 38d is provided on a slot 38e for inserting the SD card into the SD card drive unit 14.

This note PC 1 is for overseas market (the second configuration) that needs high performance VGA function and Bluetooth function. Therefore, the high performance VGA device 30 and the Bluetooth unit 32 are installed on the motherboard 24 in the note PC 1. And more, the heat sink unit for cooling the high performance VGA device 30 is also installed in the note PC 1. As shown in FIG. 6B, there are not so many devices near the bottom face of the heat sink unit 38, and the heat sink unit 38 arranged above the motherboard 24 so as to cover the electronic devices for overseas only does not interfere to the Bluetooth unit 32 or the connector 34 for heat sink unit. Therefore, the main unit 4 of the note PC 1 for overseas market can be thin. The heat sink unit 38 is a thin rectangular parallelepiped shape, and the rectangular area projected on the motherboard 24 is approximately the same as that of a floppy disk drive unit (a first electronic device, a drive unit for portable storage media) 40 explained later. The projected area is in accordance with the area of the specific area A. Concretely, the projected area is not more than the area of the specific area A. Thus, the heat sink unit 38 can be arranged in the range of the specific area A. The size of the specific area is preferably 96 mm×126 mm or smaller to arrange the heat sink unit 38 or the floppy disk drive unit 40 in the range of the specific area A and to secure the install area for other devices on the motherboard 24.

The standard VGA device 28 and the high performance VGA device 30 are installed at the position substantially adjacent to the extension connector part 22 for the port replicator. These VGA devices can put out their performance more sufficiently when they are closer to the extension connector part 22. Two VGA devices 28, 30 are substantially adjacent to the extension connector part 22 in the note PC 1, the VGA devices can put out their performance sufficiently without suffering bad influence of the noise signal. The distance from the standard VGA device 28 to the extension connector part 22 and the distance from the high performance VGA device 30 to the extension connector part 22 are approximately the same. Thus, the transmission quality of the image signal is approximately the same in the note PC for domestic market and in that for overseas market.

The Explanation of a Notebook Type Personal Computer For Domestic Market

As a note PC 1 for domestic (Japanese) market does not need high performance VGA function and Bluetooth function, the electronic devices for overseas only are not installed on the motherboard 24. The floppy disk drive unit 40 is installed in the main unit 4, because it is demanded instead of the electronic devices for overseas only. As the high performance VGA device 30 is not installed, the heat sink unit 38 is not installed either. The floppy disk drive unit 40 is installed above the specific area A. As the devices for overseas only are not installed, the floppy disk drive unit 40 can be arranged right above and very close to the motherboard 24, the main unit 4 of the note PC 1 for domestic market can be thin. As the results, the package of the main unit 4 can be used in common for domestic market and for overseas market. The size of the package can be reduced to approximately 333 mm×285 mm×38 mm. The area of the specific area A is more than the area of the floppy disc drive unit 40 projected to the motherboard 24. Therefore, the floppy disk drive unit 40 can be arranged in the range of the specific area A.

By arranging the electronic devices for overseas only in the specific area A unitedly as previously explained, the floppy disk drive unit 40 can be arranged in the range of the specific area A with achieving the thin main unit of the note PC 1 for domestic market that does not include the electronic devices for overseas only. Therefore, the motherboard 24 can be used in common in the note PC 1 for overseas market and for domestic market.

Further, the present invention is not limited to this preferred embodiment, and various variations and modifications may be made without departing from the scope of the present invention. For example, the present invention is not limited to the notebook type personal computer, but can be applied to other various electronic apparatuses such as different types of computers or handy data processing units.

According to the present invention, the circuit board can be used in common, for example, for a plurality of grades or for domestic market and for overseas market. It is not necessary to produce many kinds of the circuit boards for one series of the electronic apparatus. Therefore, it can decrease the production cost and increase the assembling performance. If a function is not installed in the electronic apparatus for domestic market and the same function is installed in that for overseas market, a plurality of the electronic devices in relation to the function are not installed on the circuit board for domestic market and are installed on that for overseas market. Arranging these electronic devices in the specific area unitedly can generate an empty area that has no electronic devices on the circuit board for domestic market. Thus, it will be easy to install other functions or other units that is necessary for domestic market but not necessary for overseas market in the empty area on the circuit board.

What is claimed is:

1. A circuit board which is used in common for a first electronic apparatus as a first configuration and for a second electronic apparatus as a second configuration, said circuit board comprising an area which is used in common for installing a first electronic device in installing the circuit board into the first electronic apparatus, and for installing a second electronic device in installing the circuit board into the second electronic apparatus, wherein the first electronic device is particularly used for the first electronic apparatus, and the second electronic device is particularly used for the second electronic apparatus, wherein an extension connector part is installed on the circuit board, said extension connector connects an extension unit that is removably attachable to the first electronic apparatus and the second electronic apparatus, and wherein the extension connector part is installed in an overlapped area that is used both when the circuit board is installed in the first electronic apparatus and when the circuit board is installed in the second electronic apparatus.

2. The circuit board according to claim 1, wherein an install position of the extension connector part is within a specific distance from a back face of the first or second electronic apparatus when the circuit board is installed in the first or second electronic apparatus, and within a specific distance from a centerline of width of the first or second electronic apparatus.

3. An electronic appliance that comprises a circuit board used in common for a first electronic apparatus as a first configuration and for a second electronic apparatus as a second configuration, the circuit board comprising an area used in common for installing a first electronic device in installing the circuit board into the first electronic apparatus, and for installing a second electronic device in installing the circuit board into the second electronic apparatus, wherein the first electronic device is particularly used for the first electronic apparatus, and the second electronic device is particularly used for the second electronic apparatus;

wherein an extension connector part is installed on the circuit board, said extension connector connects an extension unit that is removably attachable to the first electronic apparatus and the second electronic apparatus; and wherein the extension connector part is installed in an overlapped area that is used both when the circuit board is installed in the first electronic apparatus and when the circuit board is installed in the second electronic apparatus.

4. An electronic appliance that comprises a circuit board used in common for a first electronic apparatus as a first configuration and for a second electronic apparatus as a second configuration, the circuit board comprising an area used in common for instaUing a first electronic device in installing the circuit board into the first electronic apparatus, and for installing a second electronic device in installing the circuit board into the second electronic apparatus, wherein the first electronic device is particularly used for the first electronic apparatus, and the second electronic device is particularly used for the second electronic apparatus;

wherein an extension connector part is installed on the circuit board, said extension connector connects an extension unit that is removably attachable to the first electronic apparatus and the second electronic apparatus; and wherein the extension connector part is installed in an overlapped area that is used both when the circuit board is installed in the first electronic apparatus and when the circuit board is installed in the second electronic apparatus; and wherein an install position of the extension connector part is within a specific distance from a back face of the first or second electronic apparatus when the circuit board is installed in the first or second electronic apparatus, and within a specific distance from a centerline of width of the electronic apparatus.

* * * * *